United States Patent
Katsap et al.

(10) Patent No.: US 6,492,647 B1
(45) Date of Patent: Dec. 10, 2002

(54) ELECTRON GUNS FOR LITHOGRAPHY TOOLS

(75) Inventors: Victor Katsap, Belle Mead, NJ (US); James Alexander Liddle, Westfield, NJ (US); Warren Kazmir Waskiewicz, Clinton, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/310,701

(22) Filed: May 7, 1999

(51) Int. Cl.[7] ................................ H01J 37/30
(52) U.S. Cl. .................. 250/492.2; 250/492.23; 250/423 F; 313/308; 313/161.1; 313/158; 219/121.27; 219/121.19
(58) Field of Search .............. 250/492.2, 492.22, 250/492.3, 427, 423 F, 492.23; 313/308, 361.1, 158; 219/121.27, 121.19

(56) References Cited

U.S. PATENT DOCUMENTS

| | | | |
|---|---|---|---|
| 3,614,422 A | * | 10/1971 | Matsui |
| 4,588,928 A | * | 5/1986 | Liu et al. |
| 4,687,938 A | * | 8/1987 | Tamura et al. |
| 5,079,112 A | * | 1/1992 | Berger et al. |
| 5,132,593 A | * | 7/1992 | Nishihara ............ 315/5.41 |
| 5,258,246 A | * | 11/1993 | Berger et al. |
| 5,763,893 A | * | 6/1998 | Nakasuji |
| 5,866,974 A | * | 2/1999 | Herrmann et al. ......... 313/308 |
| 5,872,366 A | * | 2/1999 | Ooach et al. |
| 5,932,882 A | * | 8/1999 | England et al. |
| 5,949,078 A | * | 9/1999 | Ooach et al. |

* cited by examiner

Primary Examiner—Kiet T. Nguyen
(74) Attorney, Agent, or Firm—Peter V. D. Wilde; Thomas, Kayden, Horstemeyer & Risley LLP

(57) ABSTRACT

The specification describes a method and apparatus for electron beam lithography wherein a Wehnelt electron gun is modified to improve the uniformity of the electron beam. The bias on the Wehnelt aperture is reversed from the conventional bias so that it is biased positively with respect to the cathode. The Wehnelt opening is tapered with a disk emitter inserted into the taper. The result of these modifications is an electron beam output with low brightness which is highly uniform over the beam cross section.

10 Claims, 5 Drawing Sheets

−200−500 V

ELECTRON GUNS FOR LITHOGRAPHY TOOLS

FIELD OF THE INVENTION

This invention relates to electron beam lithography apparatus used for the manufacture of semiconductor integrated circuits.

BACKGROUND OF THE INVENTION

Electron beam exposure tools have been used for lithography in semiconductor processing for more than two decades. The first e-beam exposure tools were based on the flying spot concept of a highly focused beam, raster scanned over the object plane. The electron beam is modulated as it scans so that the beam itself generates the lithographic pattern. These tools have been widely used for high precision tasks, such as lithographic mask making, but the raster scan mode is found to be too slow to enable the high throughput required in semiconductor wafer processing. The electron source in this equipment is similar to that used in electron microscopes, i.e. a high brightness source focused to a small spot beam.

More recently, a new electron beam exposure tool was developed based on the SCALPEL (SCattering with Angular Limitation Projection Electron-beam Lithography) technique. In this tool, a wide area electron beam is projected through a lithographic mask onto the object plane. Since relatively large areas of a semiconductor wafer (e.g. 1 mm$^2$) can be exposed at a time, throughput is acceptable. The high resolution of this tool makes it attractive for ultra fine line lithography, i.e sub-micron.

The requirements for the electron beam source in SCALPEL exposure tools differ significantly from those of a conventional focused beam exposure tool, or a conventional TEM or SEM. While high resolution imaging is still a primary goal, this must be achieved at relatively high (100–1000 $\mu$A) gun currents in order to realize economic wafer throughput. The axial brightness required is relatively low, e.g. $10^2$ to $10^4$ Acm$^{-2}$sr$^{-1}$, as compared with a value of $10^6$ to $10^9$ Acm$^{-2}$sr$^{-1}$ for a typical focused beam source. However, the beam flux over the larger area must be highly uniform to obtain the required lithographic dose latitude and CD control.

A formidable hurdle in the development of SCALPEL tools was the development of an electron source that provides uniform electron flux over a relatively large area, has relatively low brightness, and has an electron emitter with a sufficient lifetime to avoid excessive downtime. Lanthanum hexaboride (LaB$_6$) emitters in a modified Wehnelt electron gun arrangement were found to be promising for this application, and the first SCALPEL tools were built with these electron sources. Efforts to improve the uniformity of the electron emission profile over the surface of the LaB$_6$ have continued, but with limited success. Replacement of the LaB$_6$ emitter with a simple tantalum disk was found to improve the surface emission uniformity and stability. While SCALPEL systems are regarded as highly successful fine line lithographic exposure tools, there is a continuing search for electron gun designs that improve the efficiency and uniformity of the electron beam source.

STATEMENT OF THE INVENTION

We have developed a new electron beam source for SCALPEL systems which uses a modified Wehnelt gun design wherein the Wehnelt electrode is biased in reverse of the Wehnelt gun used in conventional SCALPEL tools. The modified Wehnelt gun also has a tapered opening, with the electron emitter recessed into the tapered opening. The result of these modifications is a laminar electron beam with low brightness and essentially no crossover. These beam properties are ideal for a SCALPEL tool, which does not require focusing optics in the near field.

The invention will be described more specifically in the following detailed description which, taken with the drawing, will provide a greater understanding of the features that distinguish this invention from conventional electron beam sources.

DETAILED DESCRIPTION

As indicated above the electron gun of the invention is most advantageously utilized as the electron source in a SCALPEL electron beam lithography machine. Fabrication of semiconductor devices on semiconductor wafers in current industry practice contemplates the exposure of polymer resist materials with fine line patterns of actinic radiation, in this case, electron beam radiation. This is achieved in conventional practice by directing the actinic radiation through a lithographic mask and onto a resist coated substrate. The mask may be positioned close to the substrate for proximity printing or may be placed away from the substrate and the image of the mask projected onto the substrate for projection printing.

SCALPEL lithography tools are characterized by high contrast image patterns at very small linewidths, i.e 0.1 $\mu$m or less. They produce high resolution images with wide process latitude, coupled with the high throughput of optical projection systems. The high throughput is made possible by using a flood beam of electrons to expose a relatively large area of the wafer. Electron beam optics, comprising standard magnetic field beam steering and focusing, are used to image the flood beam onto the lithographic mask, and thereafter, onto the substrate, i.e. the resist coated wafer. The lithographic mask is composed of regions of high electron scattering and regions of low electron scattering, which regions define the features desired in the mask pattern. Details of suitable mask structures can be found in U.S. Pat. No. 5,079,112 issued Jan. 7, 1992, and U.S. Pat. No. 5,258,246 issued Nov. 2, 1993, both to Berger et al.

An important feature of the SCALPEL tool is the back focal plane filter that is placed between the lithographic mask and the substrate. The back focal plane filter functions by blocking the highly scattered electrons while passing the weakly scattered electrons, thus forming the image pattern on the substrate. The blocking filter thus absorbs the unwanted radiation in the image. This is in contrast to conventional lithography tools in which the unwanted radiation in the image is absorbed by the mask itself, contributing to heating and distortion of the mask, and to reduced mask lifetime.

Figure 1:
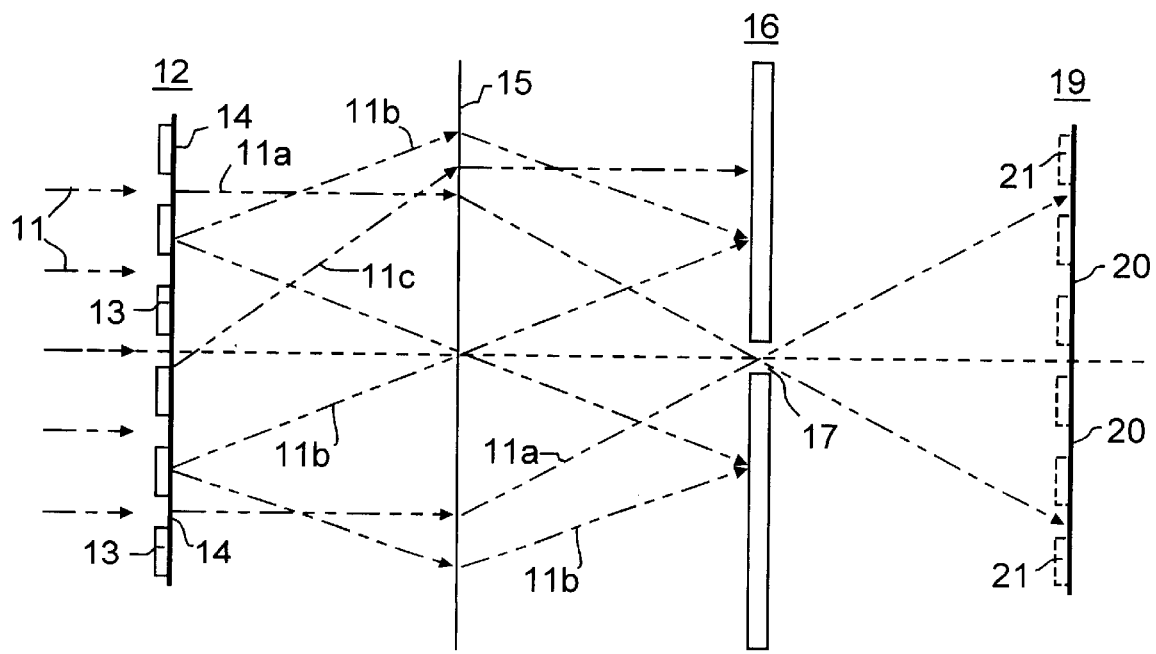
FIG. 1 is a schematic diagram illustrating the principles of the SCALPEL exposure system.

The principles on which SCALPEL lithography systems operate are illustrated by FIG. 1. Lithographic mask 12 is illuminated with a uniform flood beam 11 of 100 keV electrons. The membrane mask 12 comprises regions 13 of high scattering material and regions 14 of low scattering material. The weakly scattered portions of the beam, i.e. rays 11a, are focused by magnetic lens 15 through the aperture 17 of the back focal plane blocking filter 16. The back focal plane filter 16 may be a silicon wafer or other material suitable for blocking electrons. The highly scattered portions of the electron beam, represented here by rays 11b and 11c, are blocked by the back focal plane filter 16. The electron beam image that passes the back focal plane blocking filter 16 is focused onto a resist coated substrate located at the optical plane represented by 19. Regions 20 replicate the features 14 of the lithographic mask 12, i.e. the regions to be exposed, and regions 21 replicate the features 13 of the lithographic mask, i.e. the regions that are not to be exposed. These regions are interchangeable, as is well known in the art, to produce either negative or positive resist patterns.

The vitalizing feature of the SCALPEL tool is the positioning of a blocking filter at or near the back focal plane of the electron beam image. Further details of SCALPEL systems can be found in U.S. Pat. No. 5,079,112 issued Jan. 7, 1992, and U.S. Pat. No. 5,258,246 issued Nov. 2, 1993, both to Berger et al. These patents are incorporated herein by reference for such details that may be found useful for the practice of the invention.

It should be understood that the figures included with this description are schematic and not necessarily to scale. Device configurations, etc., are given by way of example and are not intended to convey any limitation on the device structures covered.

Figure 2:
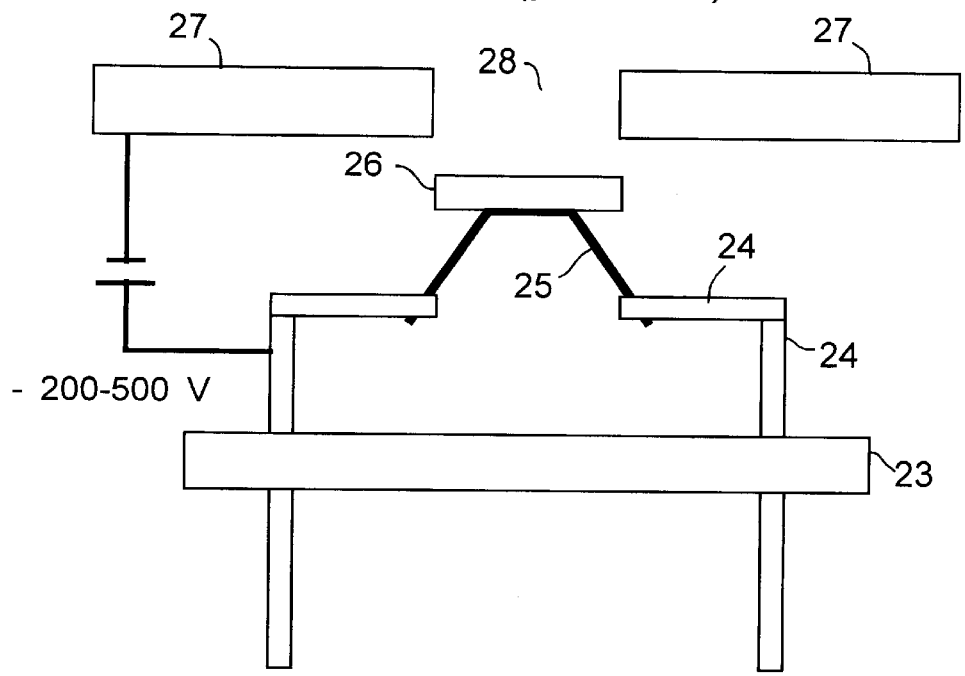
FIG. 2 is a schematic diagram of a conventional Wehnelt electron gun with a tantalum disk emitter.

The electron flood beam 11 in a conventional SCALPEL tool is typically produced by a Wehnelt electron gun. Referring to FIG. 2, a conventional Wehnelt electron gun assembly is shown with base 23, cathode support arms 24, cathode filament 25, Wehnelt electrode comprised of Wehnelt support arms 27 and conventional Wehnelt aperture 28. The base 23 may be ceramic, the support members 24 may be tantalum, steel or molybdenum. The filament 25 may be tungsten wire, the material forming the Wehnelt aperture may be steel or tantalum, and the electron emitter 26 is, e.g., tantalum. The effective area of the electron emitter is typically in the range 0.5–3.0 mm². The electron emitter is preferably a disk with a diameter in the range 0.5–2.0 mm. The emitter is spaced from the Wehnelt opening as shown, typically by a distance in the range 0.1–1.0 mm. For simplicity, the anode and the beam control apparatus are not shown. These elements are conventional and well known in the art.

The Wehnelt electron gun in a conventional SCALPEL tool is biased with the cathode, i.e. the Wehnelt opening, negative with respect to the anode by several hundred volts.

An important feature of the electron source for SCALPEL exposure tools is relatively low electron beam brightness, as mentioned earlier. For most effective exposures, it is preferred that beam brightness be limited to a value less than $10^4$ $Acm^{-2}sr^{-1}$. This is in contrast with conventional scanning electron beam exposure tools which are typically optimized for maximum brightness. See e.g. U. S. Pat. No. 4,588,928 issued May 13, 1986 to Liu et al.

Figure 3:
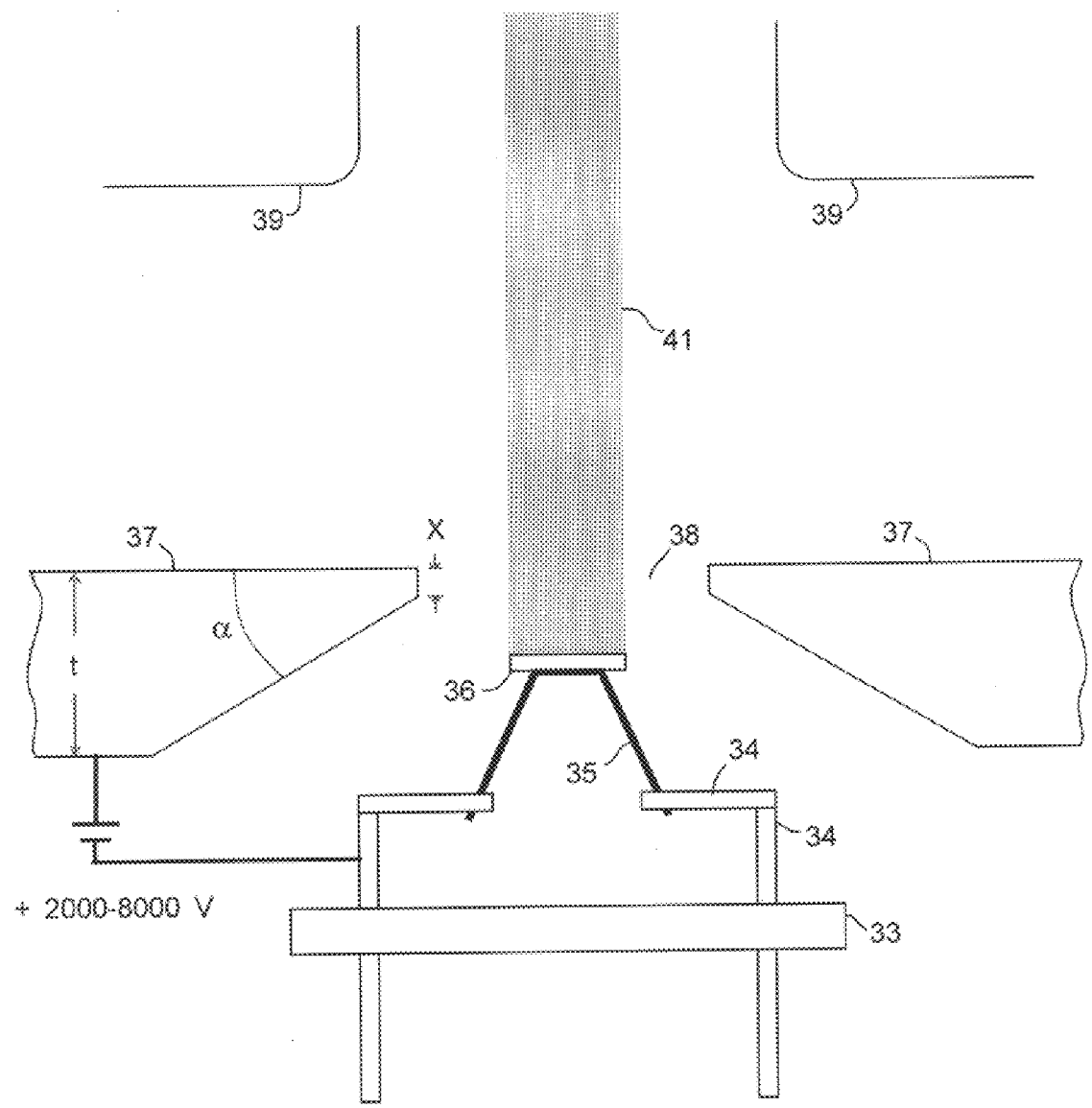
FIG. 3 is a schematic diagram of a Wehnelt electron gun modified in accordance with the invention.

The modified Wehnelt electron gun according to the invention is shown in FIG. 3. The principle departure from the standard SCALPEL Wehnelt is that the Wehnelt 37 is biased positively, with a bias in the range 2000–8000 V. This is a reverse bias compared to the standard SCALPEL Wehnelt, and results in a laminar output beam 41 with essentially parallel electron flux lines, i.e. there is little or no crossover in the electron beam pattern.

To enhance the beam characteristics from this reverse bias Wehnelt computer simulations show that the Wehnelt opening is preferably tapered, as shown in FIG. 3. FIG. 3 shows Wehnelt electrode 37 which comprises a disk with a circular opening 38. The disk 37 has a first surface and a second surface, and the opening comprises a cylindrical portion and a conical portion, with the cylindrical portion extending from the first surface of the disk to a distance X in the opening, and the conical portion extending from the cylindrical portion to the other surface of the disk. The angle of the conical portion is designated $\alpha$. The electron beam emitter 36 with supports 34 and 35 is positioned within the conical portion of the opening with electron beam 41 and anode 39 as shown.

The preferred design for the Wehnelt opening is:

t=1.5–3.5 mm and preferably 2.0–3.0 mm $\alpha$=15–40°

X=0.2–0.6 mm, and ratio of $d_1$ to $d_2$=1.2–4.0 where $d_1$ is the diameter of the Wehnelt opening and $d_2$ is the diameter of the electron emitter.

Figure 4:
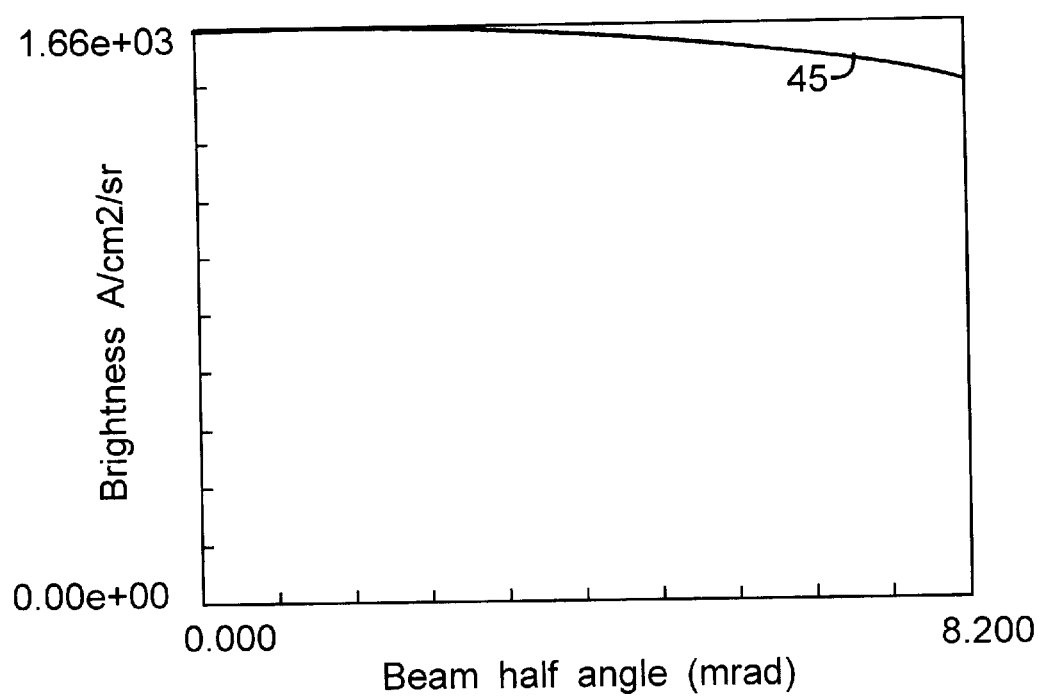
FIG. 4 is a plot of the brightness variation of the electron emission profile from the cathode of a conventional Wehnelt electron gun.
Figure 5:
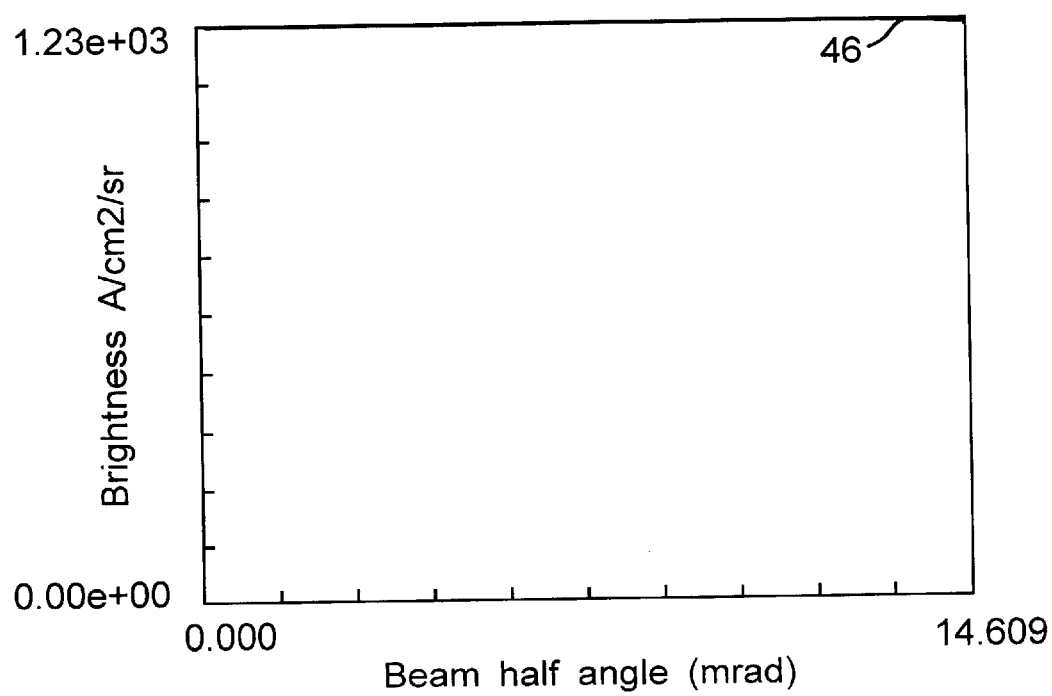
FIG. 5 is a plot of the brightness variation of the electron emission profile from the reverse biased Wehnelt according to the invention.

Results of computer simulations comparing the output beam characteristics of the conventional Wehnelt gun with the reverse biased Wehnelt gun of the invention are shown in FIGS. 4 and 5. Curve 45 in FIG. 4, simulating a conventional Wehnelt, shows beam brightness falling off considerably at less than 8.2 mrad. By contrast, the beam brightness curve 46, for the modified Wehnelt of the invention, shows uniform, and lower, beam brightness to 14.609 mrad.

Figure 6:
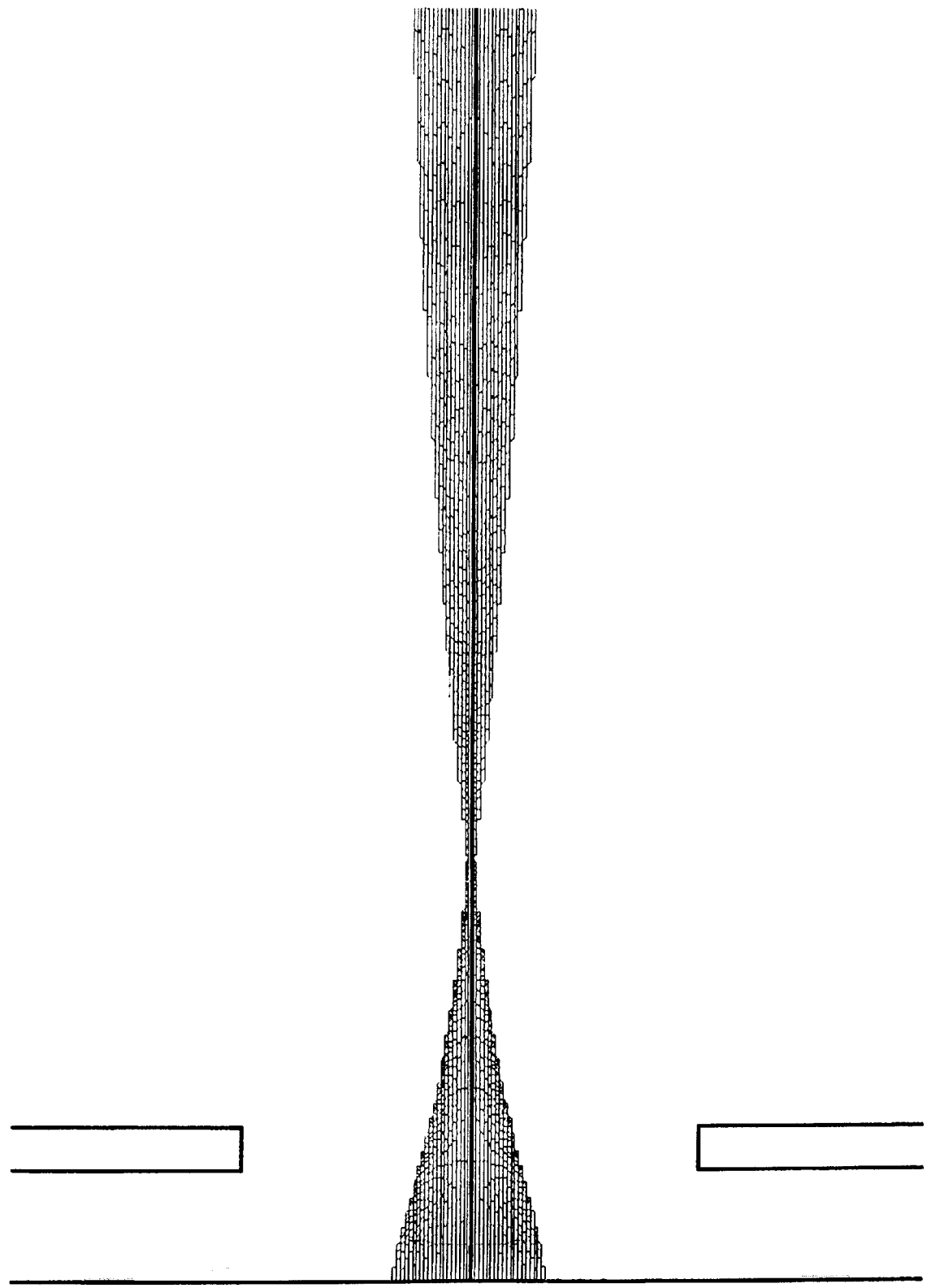
FIG. 6 is an electron emission profile from the cathode of a conventional Wehnelt electron gun.
Figure 7:
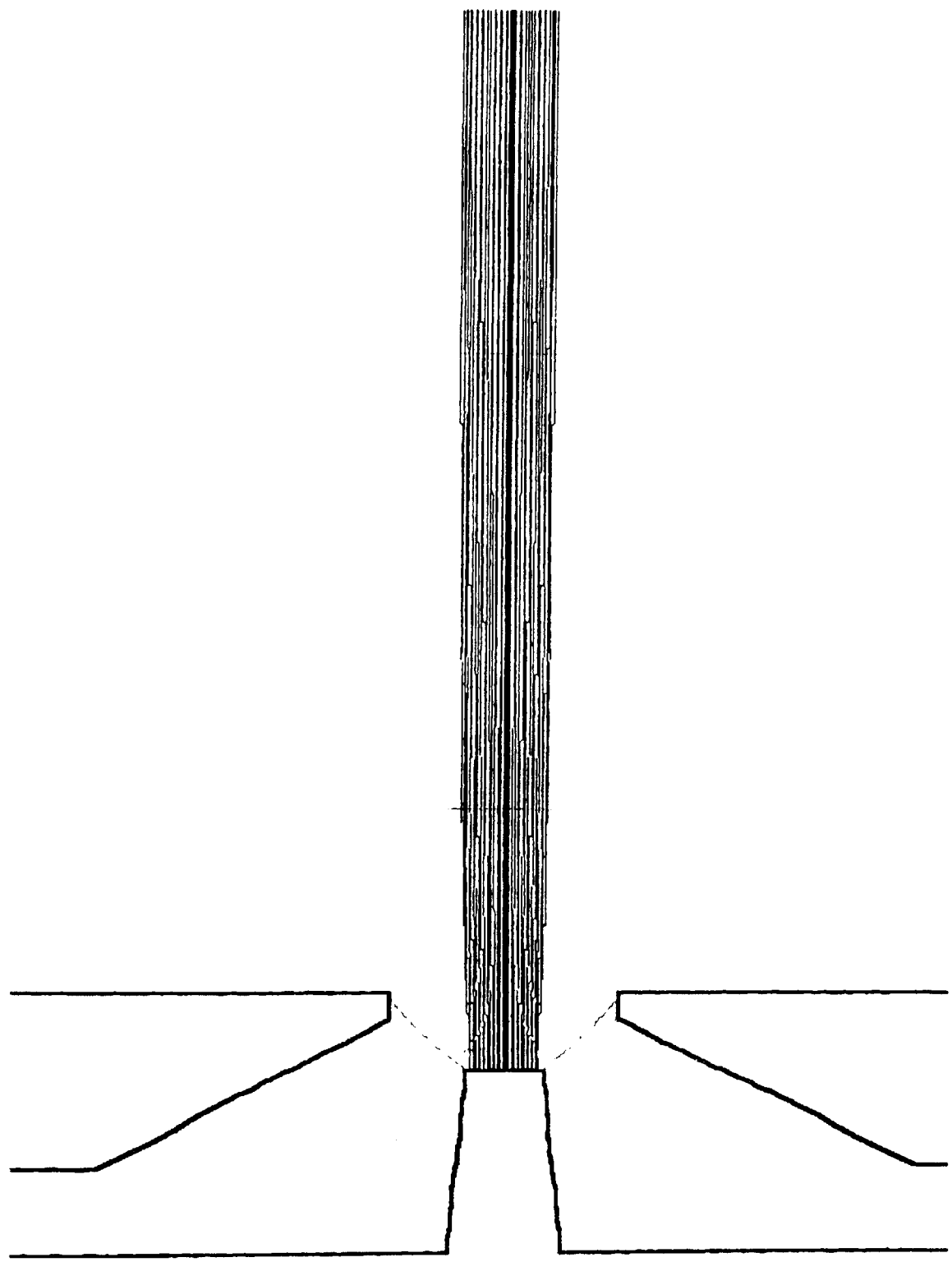
FIG. 7 is an electron emission profile from the modified Wehnelt electron gun of the invention.

A comparison of the beam profiles of the conventional and modified Wehnelts made by actual computer simulation is given by FIGS. 6 and 7. FIG. 6 shows the beam profile for a conventional Wehnelt. The crossover in the beam is evident. FIG. 7 shows the beam profile for the modified Wehnelt of the invention, with the absence of crossover evident.

For the purpose of definition here, and in the appended claims, the term electron emitter is intended to define a solid metal body with an approximately flat emitting surface, said flat emitting surface being symmetrical, i.e. having the shape of a circle or regular polygon. Also for the purpose of definition, the term substrate is used herein to define the object plane of the electron beam exposure system whether or not there is a semiconductor workpiece present on the substrate. The term electron optics plane may be used to describe an x-y plane in space in the electron beam exposure system between the electron emitting surface of the electron gun and the surface onto which the electron beam image is focused, i.e. the object plane where the semiconductor wafer is situated.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for the manufacture of semiconductor integrated circuits comprising at least one lithographic step in which a patterned electron beam is projected onto the surface of a resist coated semiconductor wafer using a lens system, the method comprising the steps of:

(a) projecting a beam of electrons onto said resist coated semiconductor wafer sequentially through:

(i) a lithographic mask, and (ii) a back focal plane filter, said back focal plane filter being essentially opaque to electrons in said electron beam, the method characterized in that said electron beam is produced by an electron gun and said electron gun is operated by (b) establishing a bias between an electron emitter, a Wehnelt aperture, and an anode so that said electron beam flows from said electron emitter through said Wehnelt aperture to said anode the method further characterized in that said Wehnelt aperture is biased positively with respect to said anode.

2. The method of claim 1 wherein said electron beam has a brightness of less than $10^4$ Acm$^{-2}$sr$^{-1}$.

3. An electron beam exposure system comprising:

(a) an electron beam emitter, (b) a Wehnelt electrode surrounding said electron beam emitter, (c) an anode, (d) a lithographic mask, (e) a back focal plane filter, (f) a substrate, (g) means including biasing means between said electron emitter, said Wehnelt electrode, and said anode, for producing an electron beam from said electron beam emitter, (h) means for directing at least portions of said electron beam sequentially through said anode, through said lithographic mask, through said back focal plane filter, and onto said substrate, the electron beam exposure system characterized in that the biasing means establishes a positive bias between the Wehnelt electrode and the anode.

4. The system of claim 3 wherein the Wehnelt electrode comprises a disk with a circular opening.

5. The system of claim 4 wherein said disk has a first surface and a second surface, and said opening comprises a cylindrical portion and a conical portion, with said cylindrical portion extending from said first surface of the disk to a distance X in said opening and said conical portion extending from said cylindrical portion to the other surface of said disk.

6. The system of claim 5 wherein said electron beam emitter is a disk.

7. The system of claim 6 wherein said electron beam emitter is positioned within said conical portion of said opening.

8. The system of claim 7 wherein said opening has a diameter $d_1$, said electron beam emitter has a diameter $d_2$, said Wehnelt electrode has a thickness t, the angle of said conical portion is $\alpha$, and:

t=1.5–3.5 mm

X=0.2–0.6 mm ratio of $d_1$ to $d_2$=1.2–4.0

$\alpha$=15–40°.

9. The system of claim 8 wherein said electron emitter comprises a tantalum disk.

10. The system of claim 3 wherein said bias means is a voltage source of 2000–8000V.

* * * * *